(12) United States Patent
Yasukawa et al.

(10) Patent No.: US 12,532,762 B2
(45) Date of Patent: Jan. 20, 2026

(54) DICING METHOD

(71) Applicant: CANON KABUSHIKI KAISHA, Tokyo (JP)

(72) Inventors: Tetsuro Yasukawa, Chiba (JP); Takeshi Shibata, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 621 days.

(21) Appl. No.: 18/049,328

(22) Filed: Oct. 25, 2022

(65) Prior Publication Data
US 2023/0154890 A1    May 18, 2023

(30) Foreign Application Priority Data

Nov. 16, 2021 (JP) ................................ 2021-186603

(51) Int. Cl.
| | | |
|---|---|---|
| H01L 23/00 | (2006.01) | |
| B23K 26/38 | (2014.01) | |
| B23K 26/53 | (2014.01) | |
| B23K 101/40 | (2006.01) | |
| B41J 2/16 | (2006.01) | |
| H01L 21/683 | (2006.01) | |
| H01L 21/78 | (2006.01) | |

(52) U.S. Cl.
CPC ............. H01L 24/94 (2013.01); B23K 26/38 (2013.01); B23K 26/53 (2015.10); H01L 21/6836 (2013.01); H01L 21/78 (2013.01); H01L 24/32 (2013.01); B23K 2101/40 (2018.08); B41J 2/1635 (2013.01); B41J 2202/22 (2013.01); H01L 2221/68327 (2013.01); H01L 2224/32145 (2013.01)

(58) Field of Classification Search
CPC ..... H01L 24/94; H01L 21/6836; H01L 21/78; H01L 24/32; H01L 2221/68327; H01L 2224/32145; B23K 26/38; B23K 26/53; B23K 2101/40; B41J 2/1635; B41J 2202/22
See application file for complete search history.

(56) References Cited

U.S. PATENT DOCUMENTS

| | | |
|---|---|---|
| 7,498,238 B2 | 3/2009 | Tamura |
| 9,299,627 B2 | 3/2016 | Nagano et al. |

(Continued)

FOREIGN PATENT DOCUMENTS

| | | |
|---|---|---|
| JP | 2001-63053 A | 3/2001 |
| JP | 2004-327578 A | 11/2004 |

(Continued)

OTHER PUBLICATIONS

Notice of Reasons for Refusal in Japanese Application No. 2021-186603 (Jul. 2025).

*Primary Examiner* — Thanh T Nguyen
(74) *Attorney, Agent, or Firm* — Venable LLP (57) ABSTRACT

A dicing method including the steps of: bonding a first wafer having a first wafer resistivity and a second wafer having a second wafer resistivity higher than the wafer first resistivity, thereby forming a bonded wafer; irradiating the bonded wafer with a laser while varying focal lengths in a thickness direction of the bonded wafer, thereby forming a plurality of modified regions along a dicing line; and dicing the bonded wafer along the dicing line by performing an expansion process on the bonded wafer formed with the modified regions.

7 Claims, 8 Drawing Sheets

(56) References Cited

U.S. PATENT DOCUMENTS

| | | |
|---|---|---|
| 9,566,791 B2 | 2/2017 | Shibata |
| 2010/0194407 A1 | 8/2010 | Nakatani |
| 2013/0049147 A1* | 2/2013 | Kerwin ................. H01L 21/304 |
| | | 257/E31.086 |
| 2019/0088624 A1* | 3/2019 | Kurosawa ............... H01L 24/94 |

FOREIGN PATENT DOCUMENTS

| | | | | |
|---|---|---|---|---|
| JP | 2007-235008 A | | 9/2007 | |
| JP | 2008-93880 A | | 4/2008 | |
| JP | 2009-88341 A | | 4/2009 | |
| JP | 2010-175482 A | | 8/2010 | |
| JP | 2010-238911 A | | 10/2010 | |
| JP | 2011207072 | * | 10/2011 | ........... H01L 21/308 |
| JP | 2011207072 A | * | 10/2011 | |
| JP | 2014-146743 A | | 8/2014 | |
| JP | 2016-157872 A | | 9/2016 | |

* cited by examiner

FIG. 1A

- S10: BOND TOGETHER WAFERS WITH DIFFERENT RESISTIVITIES
- S11: AFFIX DICING TAPE
- S12: EXECUTE STEALTH DICING
- S13: EXECUTE EXPANSION

DICING METHOD

BACKGROUND OF THE INVENTION

Field of the Invention

The present invention relates to a dicing method.

Description of the Related Art

Stealth dicing is known as a method of dicing wafers. Stealth dicing is a dicing technique that involves focusing a laser beam by an optical system using an object lens and directing the laser to a wafer along a predetermined dicing line of the wafer. More specifically, the laser is focused to a predetermined depth of the wafer to form a modified region having a reduced crystalline strength in a wafer layer at the predetermined depth. By varying the focal length of the laser and scanning the laser at several depths, multiple layers of modified regions can be formed inside the wafer. An external force is then applied in an expansion process, whereby the wafer can be separated, as cracks, which originate from these multiple modified regions, join together in the thickness direction of the wafer. Stealth dicing is a non-contact and dry wafer cutting process, hence damage or contamination of wafers can be minimized.

Japanese Patent Application Publication No. 2010-238911 proposes a stealth dicing method for bonded wafers. The method described in Japanese Patent Application Publication No. 2010-238911 uses lasers of different wavelengths in stealth dicing for efficient absorption of laser in each bonded component.

SUMMARY OF THE INVENTION

The wafer is generally half cut, i.e., not completely separated when irradiated with laser, and then separated by applying an external force in stealth dicing as described above. The method described in Japanese Patent Application Publication No. 2010-238911 changes the wavelength to achieve efficient absorption of laser in the wafer, which causes the cracks, originating from the modified regions, to be joined together more easily. There is therefore a possibility that cracks may unintentionally join together too much in some parts even before application of an external force depending on variation in wafer properties, because of which the control for uniform formation of cracks inside the wafer may be impossible. Such an uneven crack condition could compromise separation performance because the external force applied in the expansion process does not act uniformly on the entire wafer. The impact of uneven force application will be large particularly in the case where the wafer has a large number of separation lines.

The present invention has been made in view of the issue described above, and it is an object of the invention to facilitate the control for uniform formation of cracks in wafer stealth dicing, thereby improving separation performance of wafers.

The present invention provides a dicing method comprising the steps of:
bonding a first wafer having a first wafer resistivity and a second wafer having a second wafer resistivity higher than the first wafer resistivity, thereby forming a bonded wafer having regions varying in resistivity in a thickness direction;
irradiating the bonded wafer with a laser while varying focal lengths in a thickness direction of the bonded wafer, thereby forming a plurality of modified regions along a dicing line; and
dicing the bonded wafer along the dicing line by performing an expansion process on the bonded wafer formed with the modified regions The present invention can facilitate the control for uniform formation of cracks in wafer stealth dicing and improve separation performance of wafers.

Further features of the present invention will become apparent from the following description of exemplary embodiments with reference to the attached drawings.

DESCRIPTION OF THE EMBODIMENTS

Embodiments of the present invention will be hereinafter described in detail with reference to the drawings. It should be noted that the sizes, materials, shapes, and relative arrangement or the like of constituent components described in the embodiments should be altered suitably in accordance with the configuration and various conditions of an apparatus to which the invention is applied, and it is not intended to limit the scope of this invention to the following embodiments.

Stealth Dicing Method

Figure 1A:
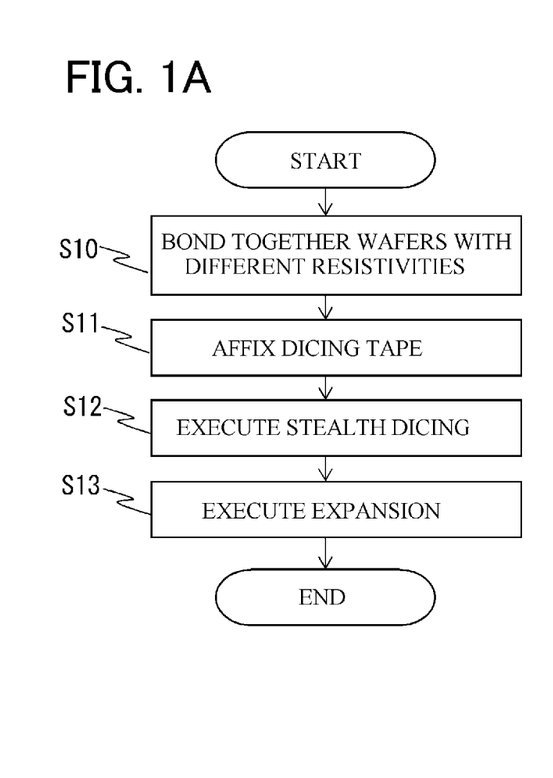
FIG. 1A and FIG. 1B are a flowchart and a diagram of stealth dicing.
Figure 1B:
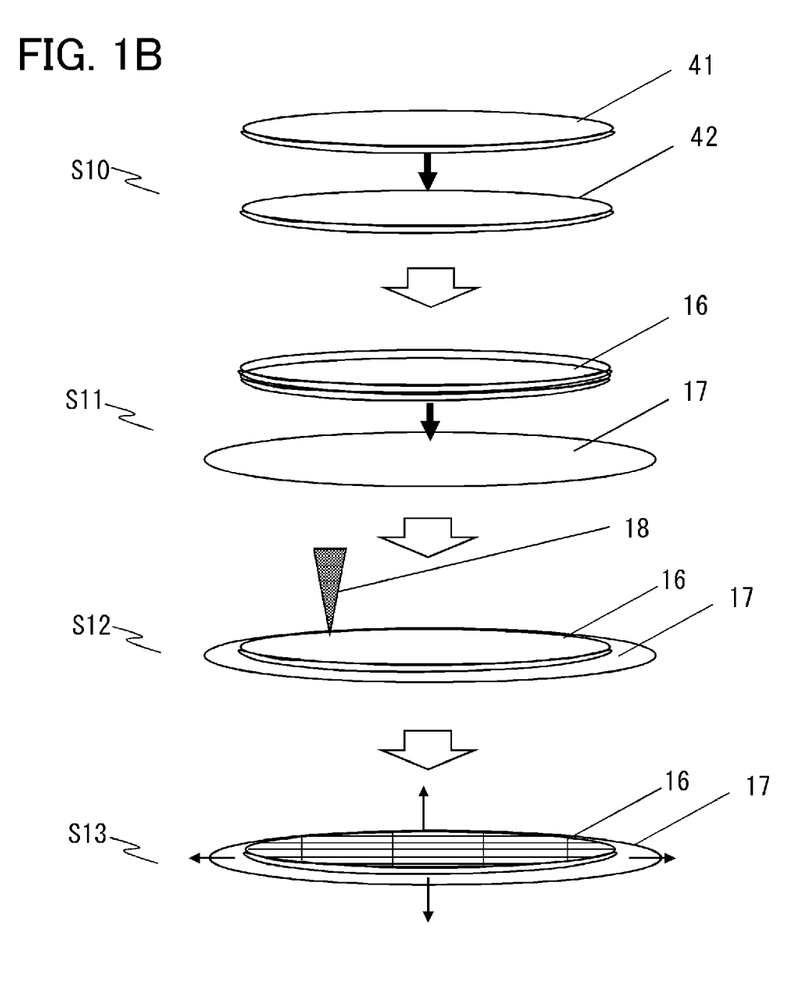
Figure 2A:
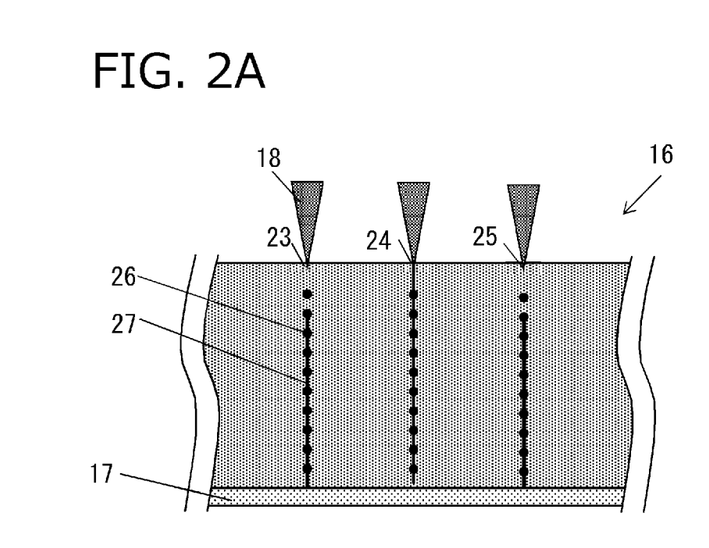
FIG. 2A and FIG. 2B are cross-sectional diagrams illustrating a separation process in stealth dicing.
Figure 2B:
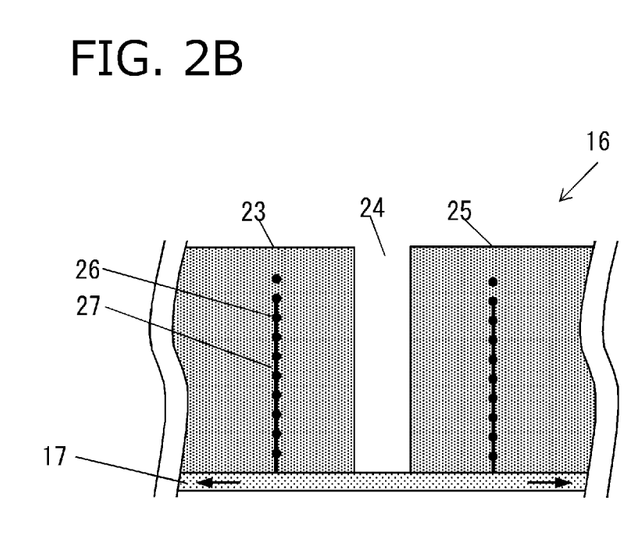
Figure 3A:
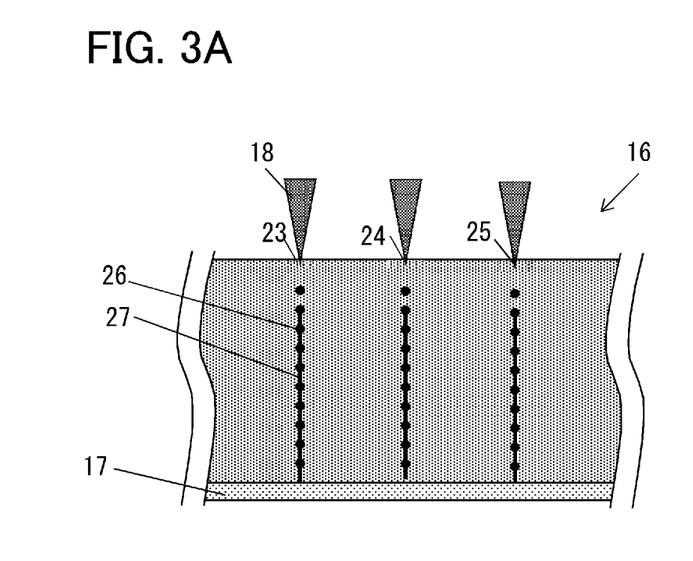
FIG. 3A and FIG. 3B are cross-sectional diagrams illustrating an ideal separation process in stealth dicing.
Figure 3B:
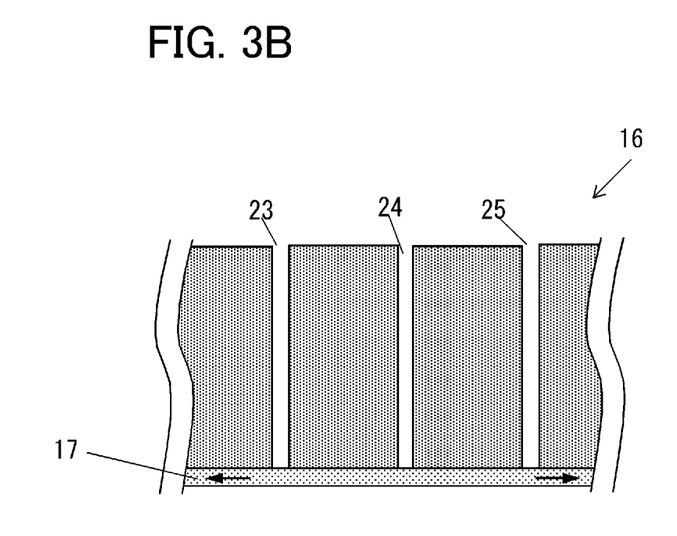

A stealth dicing method according to embodiments of the present invention will be roughly described. FIG. 1A and FIG. 1B illustrate a stealth dicing method to which the present invention is applicable. FIG. 1A is a flowchart, and FIG. 1B is a diagram of various process steps of the flowchart. FIG. 1A and FIG. 1B use the same step numbers indicating the order of steps. FIG. 2A and FIG. 2B are cross-sectional diagrams illustrating one example of a separation process in stealth dicing to which the present invention is applicable. FIG. 2A and FIG. 2B respectively illustrate a state after stealth dicing and a state after expansion. FIG. 3A and FIG. 3B are cross-sectional diagrams illustrating an ideal separation process in stealth dicing to which the present invention is applicable. FIG. 3A and FIG. 3B respectively illustrate a state after stealth dicing and a state after expansion.

First, at step S10 in FIG. 1A and FIG. 1B, a first wafer 41 and a second wafer 42 that differ in resistivity are bonded together with an adhesive or the like. Hereinafter, the bonded wafer pair of the first wafer 41 and second wafer 42 shall also be referred to simply as a wafer 16. The first wafer 41 and second wafer 42 are silicon wafers. The resistivity of the wafers will be discussed later. While two wafers are stacked upon one another here, three or more wafers may be bonded together.

Next, at step S11, a dicing tape 17 is affixed to one surface of the bonded wafer 16. The dicing tape 17 is first bonded and fixed to a commonly used dicing frame (not shown) that has a larger outer circumference than the wafer before being affixed to the wafer 16. The dicing tape 17 may be attached to the surface of either side of the wafer 16. Preferably, the dicing tape 17 should have properties that provide sufficient adhesion to be able to hold the wafer 16 during dicing, as well as allow the wafer 16 to be readily peel off after the separation. A UV-cured adhesive tape may be used, for example, so that the adhesion can be reduced after the dicing.

Next, at step S12, a laser 18 is emitted along a predetermined dicing line of the wafer 16. By varying the focal length of the laser 18 and scanning the laser at several depths, multiple modified regions can be formed along a direction intersecting the wafer surface in the wafer 16.

Lastly, at step S13, the wafer 16 is separated by an expansion process. The dicing tape 17 is expanded with a predetermined force, whereby cracks, originating from the modified regions, join together completely over the entire thickness of the wafer 16 and this leads to separation of the wafer 16. The expansion process is not limited to a particular method. An expander may be used, for example, to stretch the dicing tape 17 as indicated with arrows in FIG. 1B, to separate the wafer 16.

Favorable Expansion Conditions

Referring to FIG. 2A and FIG. 2B, one case where the cracks 27 are joined together unevenly inside the wafer 16 along the thickness direction of the wafer 16 will be described in detail. In FIG. 2A and FIG. 2B, the laser 18 has been scanned at multiple depths with varying focal lengths by the method of step S12 described above along each of a left dicing line 23, a center dicing line 24, and a right dicing line 25. This has resulted in multiple modified regions 26 shown as black dots inside the wafer 16.

As shown in FIG. 2A, the cracks 27 on the center dicing line 24 are joined together over the entire thickness of the wafer 16 at the end of step S12. This can happen depending on the conditions of the laser 18, variation in wafer 16 properties, and vibration caused by transfer of the wafer 16. The wafer is more easily separable on the center dicing line 24 where the cracks 27 are joined so that it splits there first when expanded as shown in FIG. 2B. This causes the portion of the dicing tape 17 on the center dicing line 24 to stretch more than other portions of the dicing tape 17, as a result of which the expansion force is not applied uniformly on the entire wafer 16. This deteriorates the overall separation performance of the wafer 16.

Next, one case where cracks 27 are joined together uniformly inside the wafer 16 along the thickness direction of the wafer 16 will be described in detail with reference to FIG. 3A and FIG. 3B. As shown in FIG. 3A, the cracks 27 are joined together uniformly on all the dicing lines at the end of step S12. The expansion force is therefore applied uniformly over the entire wafer 16 as shown in FIG. 3B, leading to favorable separation of the entire wafer 16.

As discussed above, it is essential that there is no unevenness in the condition of cracks 27 inside the wafer 16 between dicing lines at the end of step S12 for ensuring better separation performance of the wafer 16. However, in stealth dicing in which the wafer 16 is separated by applying an external force as described above, controlling the cracks 27 to join together uniformly over the entire thickness of the wafer 16 at the time of completion of step S12 is difficult to achieve. If the cracks 27 are not joined at all over the entire thickness of the wafer 16, it will be difficult to separate the wafer 16.

Accordingly, an optimal condition for achieving better separation performance of the wafer 16 would be to create disconnected regions in parts of the cracks 27 in all the dicing lines as shown in FIG. 3A and FIG. 3B. In other words, it is essential that the cracks 27 are not completely joined together over the entire thickness of the wafer 16. It is also important that the condition of cracks 27 (how they are connected) is as uniform as possible in all the dicing lines.

Disconnected regions in cracks 27 may compromise the cutting accuracy when the wafer is separated by applying an expansion force. Too many disconnected regions in the cracks 27 could make separation of the wafer 16 impossible at all as mentioned above. Therefore, there should preferably be more connected regions than disconnected regions in the cracks 27 in each of the dicing lines extending in the thickness direction of the wafer 16.

Configuration for Favorable Expansion

Based on the above, the inventors decided to vary the wafer resistivity in the thickness direction to improve the separation performance of wafers 16 in stealth dicing. A wafer 16 with a high resistivity has a low impurity content. The wafer is therefore less affected by attenuation of the laser 18 and allows easy formation of modified regions 26 by the laser 18 and cracks 27 can readily join together. Contrarily, a wafer 16 with a low resistivity has a high impurity content. The wafer is therefore more affected by attenuation of the laser 18. Modified regions 26 are formed by the laser 18 less easily and cracks 27 are harder to join together. Therefore, providing regions with a low wafer resistivity in parts in the thickness direction of the wafer to stop crack propagation there can reduce the influence of variation in wafer 16 properties, and facilitate the control for uniform formation of cracks 27 in the wafer 16. These will contribute to better separation performance of wafers 16 in stealth dicing.

In order to avoid poor cutting accuracy or a situation where the wafer 16 cannot be separated at all as mentioned above, there should preferably be more regions with a high wafer resistivity where cracks 27 can join together easily than regions with a low wafer resistivity where cracks 27 are harder to join together in the thickness direction. The points where the wafer resistivity is locally reduced can be anywhere in the thickness direction of the wafer and may be set suitably in accordance with purpose of use.

"High" or "low" wafer resistivity described herein is not in relation to an absolute reference value but refers to the presence of regions where the wafer resistivity is relatively high or low in the thickness direction of the wafer 16. A difference in impurity content that changes the wafer resistivity can be created by varying the doping amount of impurities during the production of the wafer. Therefore, a "high" or "low" impurity content in the wafer 16 is not in relation to an absolute reference value but refers to the presence of regions where the impurity content is relatively high or low in the thickness direction of the wafer 16.

A silicon wafer without any impurities has a resistivity of about 1 kΩ·cm. Generally, wafers contain impurities, and the wafer resistivity is controlled to be in the range of 0.1 to 100 kΩ·cm as required in accordance with the purpose of use. In this embodiment, the wafer resistivity need only be varied in the thickness direction of the wafer and controlled to be in the general range of 0.1 to 100 kΩ·cm as required in accordance with the purpose of use. As described above, regions with a relatively low impurity content have a high wafer resistivity, and regions with a relatively high impurity content have a low wafer resistivity. Namely, the wafer according to the present invention is configured to include high-impurity-content regions in parts in the thickness direction of the wafer to control cracks 27 inside the wafer 16 to be uniform by stopping crack propagation in these parts.

Embodiment 1

Figure 4:
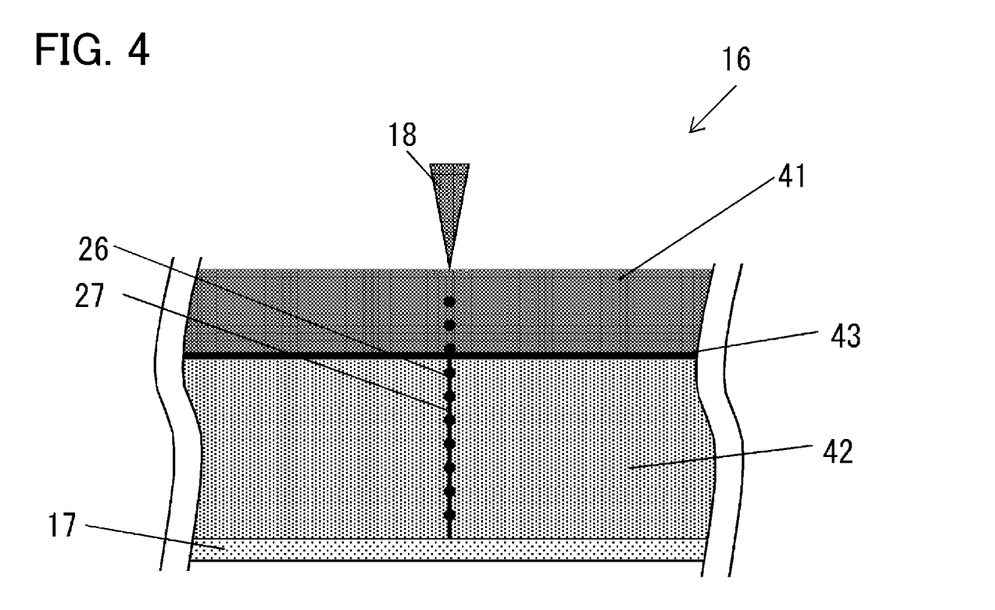
FIG. 4 is a diagram illustrating a wafer configuration in Embodiment 1.
Figure 5:
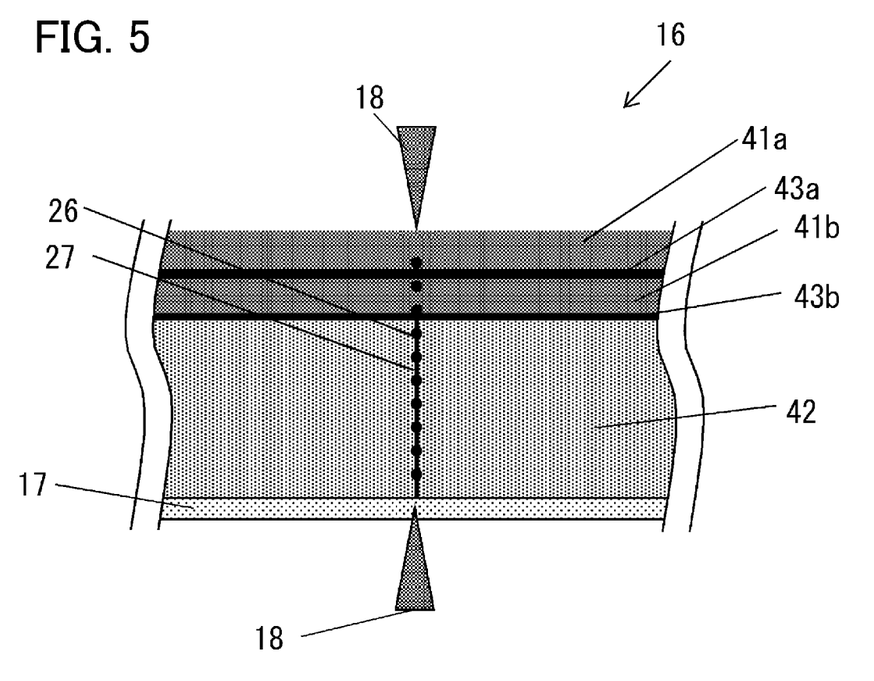
FIG. 5 is a diagram illustrating another wafer configuration in Embodiment 1.

Embodiment 1 of the present invention will be described in specific terms with reference to FIG. 4 and FIG. 5. FIG. 4 is a cross-sectional diagram illustrating the wafer configuration in Embodiment 1. FIG. 5 is a diagram illustrating another wafer configuration in Embodiment 1.

FIG. 4 shows a wafer 16 with a double-layer structure in which two wafers, a wafer 41 with a low resistivity and a wafer 42 with a high resistivity, are bonded together via an adhesive layer 43. The wafer 41 having a low resistivity forms a region with a low wafer resistivity, and the wafer 42 having a high resistivity forms a region with a high wafer resistivity. The wafer 41 having a low resistivity and the wafer 42 having a high resistivity are a wafer with a high impurity content and a wafer with a low impurity content, respectively, and the wafer 16 is a pair of these wafers bonded together.

FIG. 5 shows a wafer 16 having a total of three layers including two layers with a low wafer resistivity. A first wafer 41a having a low resistivity and a second wafer 41b having a low resistivity are bonded together via a first adhesive layer 43a, and the second wafer 41b having a low resistivity and a wafer 42 having a high resistivity are bonded together via a second adhesive layer 43b.

The wafer 16 shown in FIG. 4 and FIG. 5 partially includes a region with a low wafer resistivity (corresponding to the wafer 41 having a low resistivity) in the thickness direction, so that propagation of the cracks 27 that have joined together in the region with a high wafer resistivity (corresponding to the wafer 42 having a high resistivity) can be partially stopped. The joined cracks 27 have a length corresponding to the thickness of the region with a high wafer resistivity, meaning that the cracks 27 in each dicing line of the wafer 16 can be readily controlled to a uniform length.

In this embodiment, the wafer 42 having a high resistivity is on the side in contact with the dicing tape 17, the wafer 41 having a low resistivity being on the opposite side. Therefore, cracks 27 join together more readily on the side facing the dicing tape 17 where separation starts. It is unlikely that the wafer 16 cannot be separated at all. Moreover, the region with a low wafer resistivity partially stopping propagation of cracks 27 creates a uniform condition of cracks 27, offering consistency in separation performance.

The wafer 16 in this embodiment in FIG. 4 has a thickness of 200 μm in the region with a low wafer resistivity and 400 μm in the region with a high wafer resistivity. The wafer 16 may contain a plurality of at least one of the wafer 41 having a low resistivity and the wafer 42 having a high resistivity. For example, FIG. 5 shows a plurality of (here, two) wafers 41 having a low resistivity, denoted at 41a and 41b. The wafers 41a and 41b in FIG. 5 having a low resistivity are each 100 μm in thickness, so that the region with a low wafer resistivity has an overall thickness of 200 μm. The shape or area in the surface direction of the wafer are not limited particularly. An 8-inch circular wafer may be used, for example.

The wafer 42 having a high resistivity in this embodiment has a resistivity of 12 to 24 Ω·cm, and the wafer 41 having a low resistivity has a lower resistivity than the former, of 1 to 11 Ω·cm. The thicknesses and resistivities of the wafers mentioned above are merely examples and not limiting.

According to this embodiment, cracks 27 are controlled by varying wafer resistivity, so that there is no need to largely change the conditions of the laser 18 inside the wafer 16. The conditions of the laser 18 in this embodiment require no more than general adjustments, such as laser power output adjustment, or fine position or pitch adjustment of the modified regions 26 in the thickness direction, in consideration of the impact of attenuation of the laser 18 depending on the thickness of the wafer 16, or the impact of attenuation caused by the adhesive layer 43.

While the laser 18 in FIG. 4 is emitted from the opposite side from the side in contact with the dicing tape 17, it is also possible to irradiate the side in contact with the dicing tape 17 with the laser. In the case with a wafer having multiple bonded layers such as the one shown in FIG. 5, the laser 18 may advantageously be emitted from both sides of the wafer as shown to reduce the impact of attenuation caused by the adhesive layers 43.

As described above, according to this embodiment, the wafer resistivity is varied distinctively in the thickness direction, to reduce the influence of variation in wafer 16 properties, and to facilitate the control for uniform formation of cracks 27 inside the wafer 16. The expansion force is therefore applied uniformly over the entire wafer 16, which can contribute to better separation performance of wafers in stealth dicing. More preferably, the wafer may be designed such that cracks 27 join together more easily on the side in contact with the dicing tape 17 where separation starts as shown in FIG. 4, and that cracks 27 are harder to join together on the opposite side, to improve the separation performance of the wafer.

Embodiment 2

Figure 6:
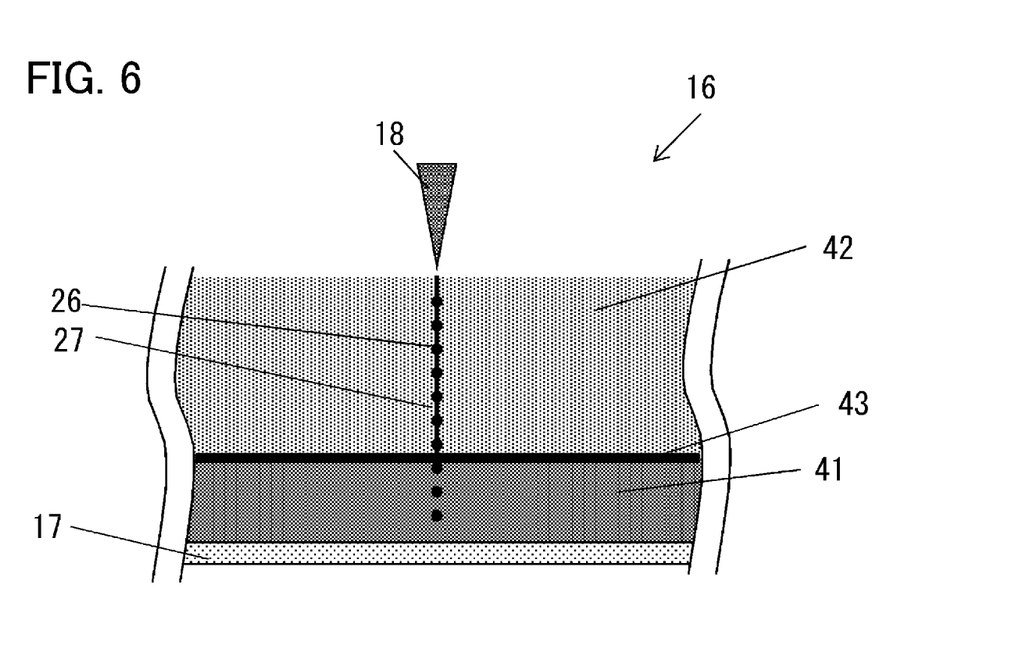
FIG. 6 is a diagram illustrating a wafer configuration in Embodiment 2.

Embodiment 2 of the present invention will be described in specific terms with reference to FIG. 6. FIG. 6 is a cross-sectional diagram illustrating the wafer configuration in Embodiment 2. Similarly to Embodiment 1, the wafer 16 is a pair of a wafer 41 having a low resistivity and a wafer 42 having a high resistivity bonded together via an adhesive layer 43. Similarly to Embodiment 1, the wafer partially includes a region with a low wafer resistivity (corresponding to the wafer 41 having a low resistivity). Propagation of the cracks 27 that have joined together in the region with a high wafer resistivity (corresponding to the wafer 42 having a high resistivity) can be partially stopped, which facilitates the control for uniform formation of cracks 27 in the wafer 16.

This embodiment differs from Embodiment 1 in the locations of different wafer resistivities. In this embodiment, the wafer 41 having a low resistivity is on the side in contact with the dicing tape 17, the wafer 42 with a high resistivity being on the opposite side.

This embodiment may be applicable to a case where the wafer 16 that is a wafer 42 having a high resistivity and a wafer 41 having a low resistivity bonded together allows a dicing tape 17 to be affixed only on the side where there is the wafer 41 with a low resistivity. An inkjet printer, for example, uses a bonded wafer composed of an HB (heater board) substrate providing functions as interconnects, and an ink channel substrate. The HB substrate is controlled to have a specific wafer resistivity, which tends to be high. The ink channel substrate has a wafer resistivity that is controlled to be within a wider range, and tends to have a low wafer resistivity. The dicing tape 17 is affixed to the ink channel substrate of such a wafer because of the worries that adhesive of the tape may compromise the functions of the HB substrate. This embodiment is effective in such a case.

The wafer 41 having a low resistivity and the wafer 42 having a high resistivity of the wafer 16 in this embodiment have a thickness of 300 μm and 625 μm, respectively. Similarly to Embodiment 1, the wafer 16 may contain a plurality of layers of one or both of the regions. The wafer 42 having a high resistivity in this embodiment has a resistivity of 15 to 30 Ω·cm, and the wafer 41 having a low resistivity has a lower resistivity than the former, of 1 to 14 Ω·cm. The thicknesses and resistivities of the wafers mentioned above are merely examples and not limiting.

According to this embodiment, too, cracks 27 are controlled by varying wafer resistivity, so that there is no need to largely change the conditions of the laser 18 inside the wafer 16. Similarly to the previous embodiment, the conditions of the laser 18 in this embodiment require no more than general adjustments, such as laser power output adjustment, or fine position or pitch adjustment of the modified regions 26 in the thickness direction, in consideration of the impact of attenuation of the laser 18 depending on the thickness of the wafer 16, or the impact of attenuation caused by the adhesive layer 43.

The laser 18 is emitted from the opposite side from the side in contact with the dicing tape 17, but it is also possible to irradiate the side in contact with the dicing tape 17 with the laser. The wafer may also be irradiated with the laser from both sides.

As described above, according to this embodiment, even in the case of a wafer 16 that allows a dicing tape 17 to be affixed only on one side with a low resistivity (wafer 41), the wafer resistivity is varied distinctively in the thickness direction, to reduce the influence of variation in wafer 16 properties, and to facilitate the control for uniform formation of cracks 27 inside the wafer 16. The expansion force is therefore applied uniformly over the entire wafer 16, which can contribute to better separation performance of wafers in stealth dicing.

Embodiment 3

Figure 7:
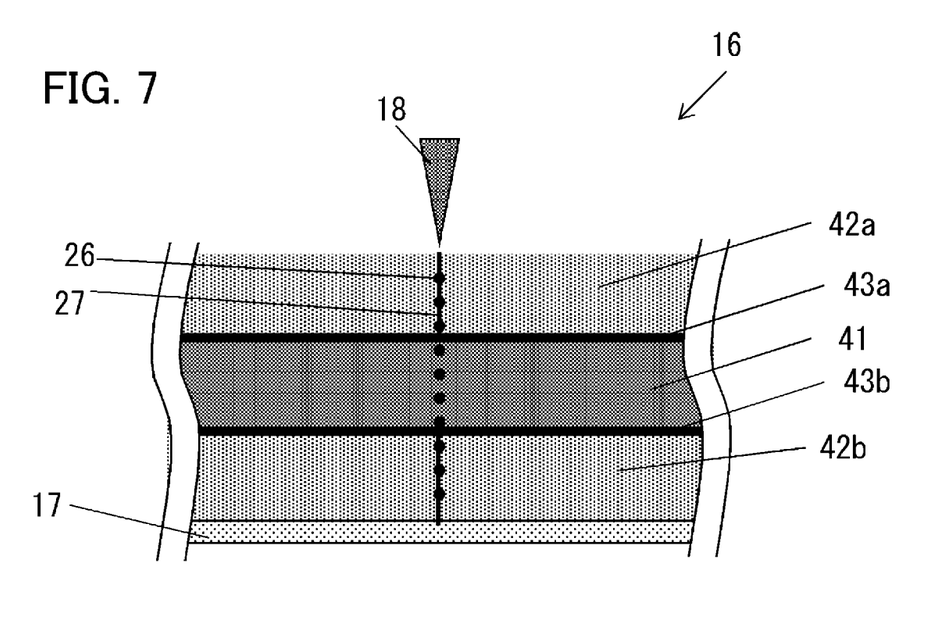
FIG. 7 is a diagram illustrating a wafer configuration in Embodiment 3.

Embodiment 3 of the present invention will be described in specific terms with reference to FIG. 7. FIG. 7 is a diagram illustrating the wafer configuration in Embodiment 3. This embodiment shows a wafer 16 composed of a single wafer 41 having a low resistivity and two wafers 42 having a high resistivity that are bonded together via an adhesive layer 43. Namely, a first wafer 42a having a high resistivity and a wafer 41 having a low resistivity are bonded together via a first adhesive layer 43a, and the wafer 41 having a low resistivity and a second wafer 42b having a high resistivity are bonded together via a second adhesive layer 43b. Thus the wafer 41 having a low resistivity is sandwiched between the wafers 42 having a high resistivity. Similarly to Embodiment 1 and Embodiment 2, the wafer partially includes a region with a low wafer resistivity (corresponding to the wafer 41 having a low resistivity). Propagation of the cracks 27 that have joined together in the region with a high wafer resistivity (corresponding to the wafer 42 having a high resistivity) can be partially stopped, which facilitates the control for uniform formation of cracks 27 in the wafer 16.

This embodiment differs from Embodiment 1 or Embodiment 2 in the locations of different wafer resistivities. The multiple layers bonded together to create multiple regions with varying wafer resistivities may be a burden for wafer production. On the other hand, the wafer 16 has regions with a high wafer resistivity on both sides where cracks 27 can readily join together, and offers good cutting accuracy on both sides of the wafer 16. Therefore, the wafer 16 offers the advantage of good cutting accuracy on both sides in addition to easy control of uniform cracks 27 by stopping crack propagation in the regions with a low wafer resistivity. This embodiment is effective in a case where the wafer 16 is required of good cutting accuracy on both sides. In an inkjet printer, for example, ink ejection ports and wirings are located on the surface of the wafer 16. Feeding ports are located on the backside of the wafer 16. This embodiment is effective in such a case where the wafer 16 is required of good cutting accuracy on both sides.

The wafer 41 having a low resistivity and the wafers 42a and 42b having a high resistivity of the wafer in this embodiment each have a thickness of 300 μm. Similarly to Embodiment 1 and Embodiment 2, the wafer 16 may contain a plurality of layers of one or both of the regions.

The wafer 42 having a high resistivity in this embodiment has a resistivity of 15 to 30 Ω·cm, and the wafer 41 having a low resistivity has a lower resistivity than the former, of 1 to 14 Ω·cm. The thicknesses and resistivities of the wafers mentioned above are merely examples and not limiting.

According to this embodiment, too, cracks 27 are controlled by varying wafer resistivity, so that there is no need to largely change the conditions of the laser 18 inside the wafer 16. The conditions of the laser 18 in this embodiment require no more than general adjustments, such as laser power output adjustment, or fine position or pitch adjustment of the modified regions 26 in the thickness direction, in consideration of the effect of attenuation of the laser 18 depending on the thickness of the wafer 16, or the effect of attenuation caused by the adhesive layer 43.

The laser 18 is emitted from the opposite side from the side in contact with the dicing tape 17, but it is also possible to irradiate the side in contact with the dicing tape 17 with the laser. The wafer may also be irradiated with the laser from both sides.

As described above, according to this embodiment, the wafer 16 offers good cutting accuracy on both sides, and by varying the wafer resistivity distinctively, the influence of variation in wafer 16 properties is reduced, and the control for uniform formation of cracks 27 inside the wafer 16 is facilitated. The expansion force is therefore applied uniformly over the entire wafer 16, which can contribute to better separation performance of wafers in stealth dicing.

Application Example

Figure 8:
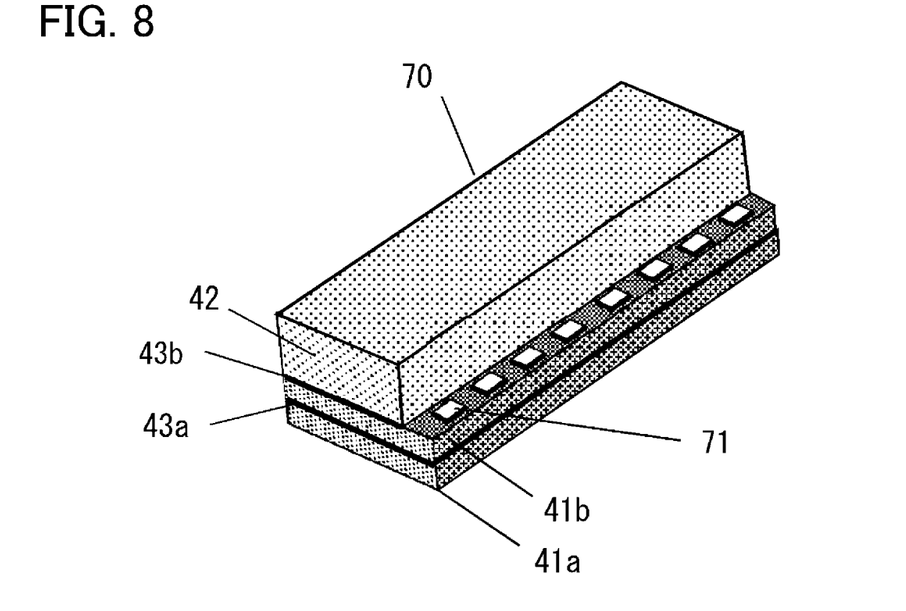
FIG. 8 is a perspective view illustrating an example in which the wafer of the present invention is applied to a chip for an inkjet printer.

FIG. 8 is a perspective diagram illustrating the configuration of a chip 70 produced using the wafer 16 of the present invention. The chip 70 in the illustrated example is configured by a first wafer 41a having a low resistivity and a second wafer 41b having a low resistivity bonded together via a first adhesive layer 43a, and the second wafer 41b having a low resistivity and a wafer 42 having a high resistivity bonded together via a second adhesive layer 43b. The layer structure of the wafer 16 is not limited to this example. As long as there are more connected regions than disconnected regions in the cracks 27 in the dicing lines, the respective regions may be formed by any number of wafers bonded in any order. The dicing tape 17 may be bonded to either side of the wafer.

The chip 70 in the illustrated example is applicable to a production method of recording elements for a recording head of an inkjet printer. An ink channel substrate is configured in the chip 70 by wafers 41 having a low resistivity (41a and 41b), with multiple ejection ports on the lower side of the first wafer 41a having a low resistivity, and ink channels for guiding ink to these ejection ports formed inside. The ejection ports are formed in the wafer 41a, while energy-generating elements that generate energy for ejecting ink from the ejection ports are formed in the wafer 41b. The wafer 42 having a high resistivity forms part of the channel substrate formed with the ink channels. Reference numeral 71 denotes terminals or electrical connection parts for electrical connection with an external device for supplying power to the energy-generating elements.

During the chip production, the terminals 71, energy-generating elements, and ejection ports are formed in patterns on the wafer 16, after which the wafer 16 is irradiated with the laser 18 to form modified regions 26 and cracks. Dicing is then performed with the use of a dicing tape 17, whereby the wafer 16 is separated into chips 70. The wafer 16 of the present invention can be used in the production of chips 70 this way, in which it ensures high cutting accuracy and good wafer separation performance in the dicing process.

As described above, according to the embodiments of the present invention, crack connection is controlled in stealth dicing, wherein the proportion of impurities is varied to change the wafer resistivity to partially provide low-resistivity regions in the wafer. This consequently facilitates the control for making the cracks inside the wafer uniform, and improves the separation performance of the wafer. The wafer resistivity is differed in the thickness direction of the wafer by bonding together a plurality of wafers having different resistivities. The thickness of a region having a specific wafer resistivity can therefore be controlled easily. Thus the influence of variation in wafer properties is reduced.

The wafer in the present invention may have three or more levels of wafer resistivity rather than two levels. Laser is attenuated as it travels into the wafer. The closer to the incident surface, the less the laser is attenuated, and the deeper from the incident surface, the more the laser is attenuated. The resistivity may therefore be varied stepwise in accordance with the expected state of attenuation to change the condition of cracks.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-186603, filed Nov. 16, 2021, which is hereby incorporated by reference wherein in its entirety.

What is claimed is:

1. A dicing method comprising steps of:
    bonding a first wafer having a first wafer resistivity and a second wafer having a second wafer resistivity higher than the first wafer resistivity, thereby forming a bonded wafer having regions varying in resistivity in a thickness direction;
    irradiating the bonded wafer with a laser while varying focal lengths in the thickness direction of the bonded wafer, thereby forming a plurality of modified regions along a dicing line; and
    dicing the bonded wafer along the dicing line by performing an expansion process on the bonded wafer formed with the modified regions,
    wherein the bonded wafer is configured such that the first wafer is configured to be sandwiched between a plurality of the second wafers.

2. The dicing method according to claim 1, wherein a region having a high wafer resistivity formed by the second wafer is configured to be larger in thickness than a region having a low wafer resistivity formed by the first wafer in the thickness direction of the bonded wafer.

3. The dicing method according to claim 1, further comprising a step of affixing a dicing tape on one surface of the bonded wafer before the step of dicing,
    wherein the expansion process is performed by stretching the dicing tape in the step of dicing.

4. The dicing method according to claim 3, wherein in the step of affixing, the dicing tape is configured to be affixed to a second wafer side of the bonded wafer.

5. A method of producing a recording element, the method comprising a step of making a plurality of recording elements for an inkjet printer from the bonded wafer by the dicing method according to claim 1.

6. A dicing method comprising steps of:
    bonding a first wafer having a first wafer resistivity and a second wafer having a second wafer resistivity higher than the first wafer resistivity, thereby forming a bonded wafer having regions varying in resistivity in a thickness direction;
    irradiating the bonded wafer with a laser while varying focal lengths in the thickness direction of the bonded wafer, thereby forming a plurality of modified regions along a dicing line; and
    dicing the bonded wafer along the dicing line by performing an expansion process on the bonded wafer formed with the modified regions,
    the method further comprising a step of affixing a dicing tape on one surface of the bonded wafer before the step of dicing,
    wherein the expansion process is performed by stretching the dicing tape in the step of dicing, and
    wherein in the step of affixing, the dicing tape is configured to be affixed to a first wafer side of the bonded wafer.

7. A dicing method comprising steps of:
    bonding a first wafer having a first wafer resistivity and a second wafer having a second wafer resistivity higher than the first wafer resistivity, thereby forming a bonded wafer having regions varying in resistivity in a thickness direction;
    irradiating the bonded wafer with a laser while varying focal lengths in the thickness direction of the bonded wafer, thereby forming a plurality of modified regions along a dicing line; and
    dicing the bonded wafer along the dicing line by performing an expansion process on the bonded wafer formed with the modified regions,
    wherein a plurality of the first wafers are configured to be bonded together to form a region with a low wafer resistivity in the thickness direction of the bonded wafer.

* * * * *